United States Patent
Lee et al.

(10) Patent No.: US 9,287,382 B1
(45) Date of Patent: Mar. 15, 2016

(54) STRUCTURE AND METHOD FOR SEMICONDUCTOR DEVICE

(71) Applicant: Taiwan Semiconductor Manufacturing Company, Ltd., Hsin-Chu (TW)

(72) Inventors: Yi-Jing Lee, Hsinchu (TW); Kun-Mu Li, Hsinchu County (TW); Chii-Horng Li, Hsinchu County (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/535,005

(22) Filed: Nov. 6, 2014

(51) Int. Cl.
*H01L 29/66* (2006.01)
*H01L 33/62* (2010.01)
*H01L 29/78* (2006.01)

(52) U.S. Cl.
CPC .... *H01L 29/66636* (2013.01); *H01L 29/66795* (2013.01); *H01L 29/7848* (2013.01); *H01L 29/7851* (2013.01)

(58) Field of Classification Search
CPC ....... H01L 33/62; H01L 33/486; H01L 33/54; H01L 33/56; H01L 29/66628; H01L 29/66636; H01L 29/665; H01L 29/7848; H01L 29/41783
USPC .......................................... 438/300; 257/100
See application file for complete search history.

(56) References Cited

U.S. PATENT DOCUMENTS

2011/0312145 A1* 12/2011 Tsai ................... H01L 21/26586
                                                                  438/300
2013/0040455 A1    2/2013 Chan et al.
2014/0134818 A1    5/2014 Cheng et al.

OTHER PUBLICATIONS

U.S. Appl. No. 62/040,880, filed Aug. 22, 2014, by inventors Chun Hsiung Tsai et al. for "Metal-Insensitive Epitaxy Formation," 18 pages of text, 5 pages of drawings.
Michael I. Current et al., "Microwave and RTA Annealing of Phos-Doped, Strained Si(100) and (110) Implanted with Molecular Caron Ions" , Ion Implantation and Annealing: New Process and Products section of SEMICON West 2013, San Francisco CA., Jul. 11, 2013, 17 pages, Junction Technology Group.
Bo Lojek, "Low Temperature Microwave Annealing of S/D," 16th IEEE International Conference on Advanced thermal Processing of Semiconductors—RTP2008, 9 pages.

* cited by examiner

*Primary Examiner* — Monica D Harrison
(74) *Attorney, Agent, or Firm* — Haynes and Boone, LLP

(57) ABSTRACT

A semiconductor device and method of forming the same is disclosed. The semiconductor device includes a substrate having first and second device regions. The first device region includes a first source/drain (S/D) region and the second device region includes a plurality of second S/D regions. The semiconductor device further includes a plurality of first recesses in the first S/D region and a plurality of second recesses, one in each of the second S/D regions. The semiconductor device further includes a first epitaxial feature having bottom portions and a top portion, wherein each of the bottom portions is in one of the first recesses and the top portion is over the first S/D region. The semiconductor device further includes a plurality of second epitaxial features each having a bottom portion in one of the second recesses. The second epitaxial features separate from each other.

20 Claims, 14 Drawing Sheets

STRUCTURE AND METHOD FOR SEMICONDUCTOR DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain (S/D) features for an n-type device, and epitaxially grows silicon germanium (SiGe) to form raised S/D features for a p-type device. Various techniques directed at shapes, configurations, and materials of these S/D features have been implemented to further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
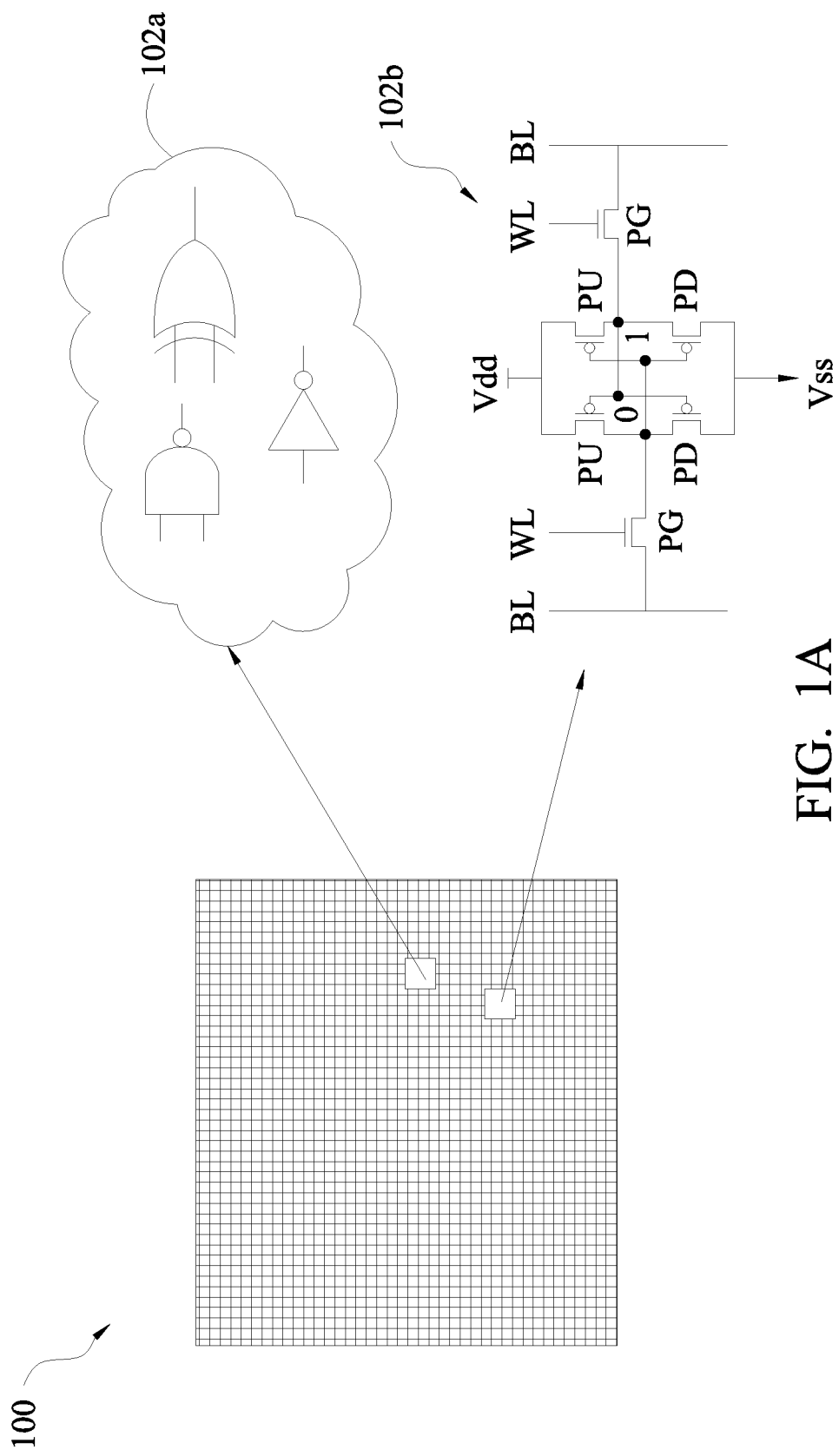
FIG. 1A illustrate a semiconductor device constructed according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and methods of forming the same. In particular, the present disclosure is related to forming raised S/D features in field effect transistors (FETs) including fin-like FETs (FinFETs).

FIG. 1A shows a semiconductor device 100 constructed according to various aspects of the present disclosure. In the embodiment as shown, the semiconductor device 100 includes various device regions. Particularly, it includes a first device region 102a and a second device region 102b. The first device region 102a includes logic devices, such as combinational and sequential logic elements (e.g., AND, OR, NAND, Inverters, flip-flops, and more complex logic circuits). The second device region 102b includes memory devices, such as static random access memory (SRAM) devices. In both regions 102a and 102b, the logic and memory devices include transistors as active components, such as p-type FETs (PFETs), n-type FETs (NFETs), FinFETs, metal-oxide semiconductor field effect transistors (MOSFET), and complementary metal-oxide semiconductor (CMOS) transistors. For example, FIG. 1A shows one SRAM cell having two pull-up (PU) FETs, two pull-down (PD) FETs, and two pass gate (PG) FETs. In various embodiments, transistors making up of a logic device and transistors making up of a memory device may have different design and fabrication requirements. For example, transistors in the logic device region 102a may be designed and fabricated for speed, power, or a combination thereof, while transistors in the memory device region 102b may be designed and fabricated for density. Furthermore, transistors in both the first and second regions may include epitaxially grown S/D features (e.g., stressor regions) to enhance carrier mobility and improve device performance.

Figure 1B:
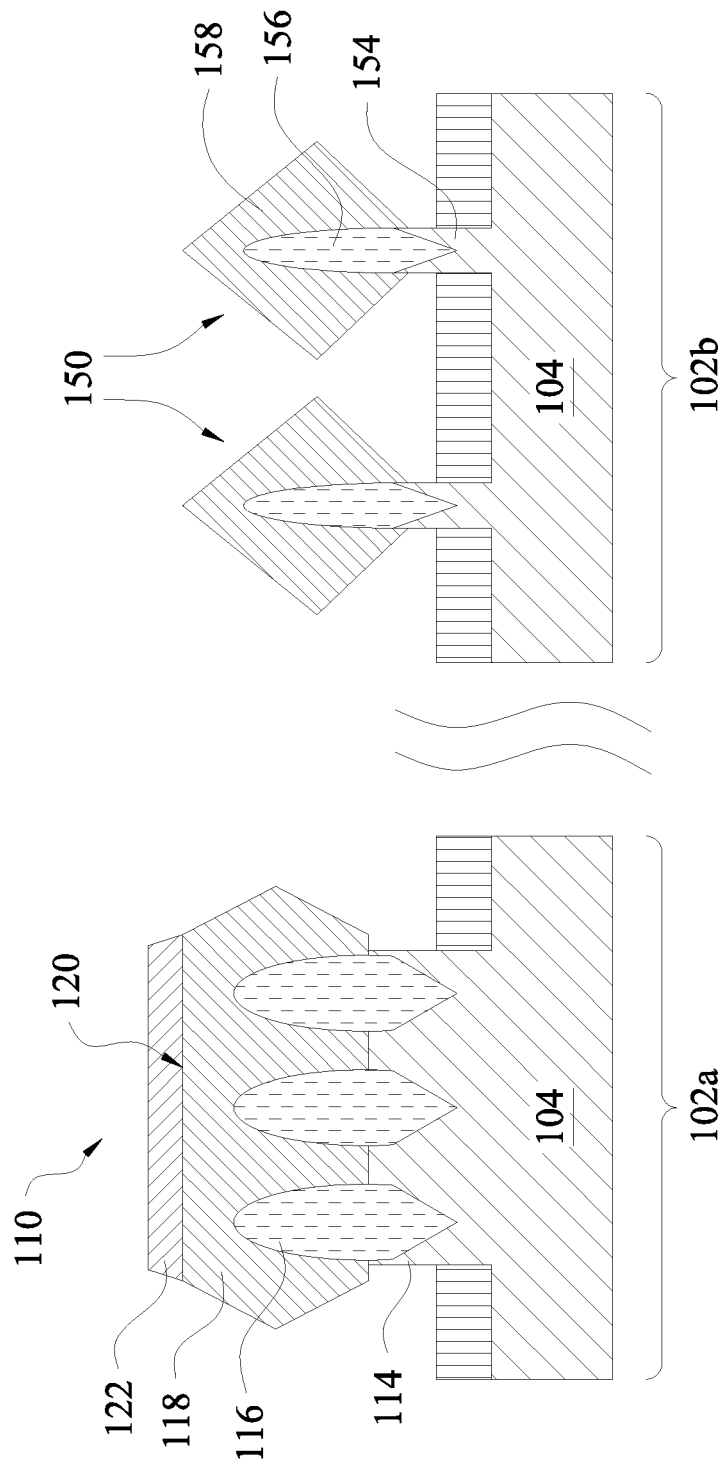
FIG. 1B illustrates epitaxially grown S/D features in two regions of the semiconductor device of FIG. 1, in accordance with an embodiment.

FIG. 1B illustrates a cross sectional view of a portion of the logic device region 102a and a portion of the memory device region 102b, in accordance with an embodiment. For purpose of simplicity, the two portions are also referred to as the logic device portion 102a and the memory device portion 102b respectively.

Referring to FIG. 1B, the portions 102a and 102b are formed over a common substrate 104. The logic device portion 102a includes an epitaxial feature 110 formed in and over an S/D region 114 of the substrate 104. The memory device portion 102b includes a plurality of epitaxial features 150 (two shown) formed in and over a plurality of S/D regions 154 (two shown). Specifically, the epitaxial feature 110 includes a plurality of first portions 116 and a second portion 118. Each of the first portions 116 grows out of a recess in the S/D region 114. The second portion 118 initially grows over each individual first portion 116 and eventually merges into one piece over the S/D region 114. Particularly, the second portion 118 provides a flat top surface 120 suitable for forming other features. In an embodiment, a silicide feature may be formed over the flat top surface 120. In the present embodiment, the epitaxial feature 110 further includes a third portion 122 that grows over the flat top surface 120. Furthermore, a silicide feature may be formed over the third portion 122. The second and third portions, 118 and 122, are collectively referred to as the top portion of the epitaxial feature 110; while the first portions 116 are referred to as the bottom portions of the epitaxial feature 110. In an embodiment, the first, second, and third portions 116, 118, and 122 are of the same material. In that case, the interface among them may not be present and the three epitaxial features may be integrated into one crystal structure. Alternatively, the three portions may have different semiconductor materials, may be doped with different dopants, or may have different dopant concentrations.

Still referring to FIG. 1B, each of the epitaxial features 150 includes a bottom portion 156 and a top portion 158. The bottom portion 156 grows out of a recess in a respective S/D region 154. The top portion 158 grows over the respective first portion 156. The various epitaxial features 150 separate from each other (they do not merge).

The epitaxial features 110 and 150 are individually tuned to provide benefits to the semiconductor device 100. Specifically, the epitaxial feature 110 is tuned to improve device performance for a logic device, and the epitaxial feature 150 is tuned to improve device performance for a memory device. For example, the epitaxial feature 110 may be made taller with larger footprint, providing more stress for improving a logic device's performance. In addition, the epitaxial feature 110 provides a larger area for S/D contact formation, thereby reducing S/D contact resistance for a logic device. In an embodiment, the epitaxial features 110 and 150 each include silicon germanium (SiGe) for p-type devices and may be further doped with p-type dopants, such as boron or indium. In another embodiment, the epitaxial features 110 and 150 each include silicon for n-type devices and may be further doped with n-type dopants, such as phosphorus, arsenic, or a combination thereof.

Figure 2:
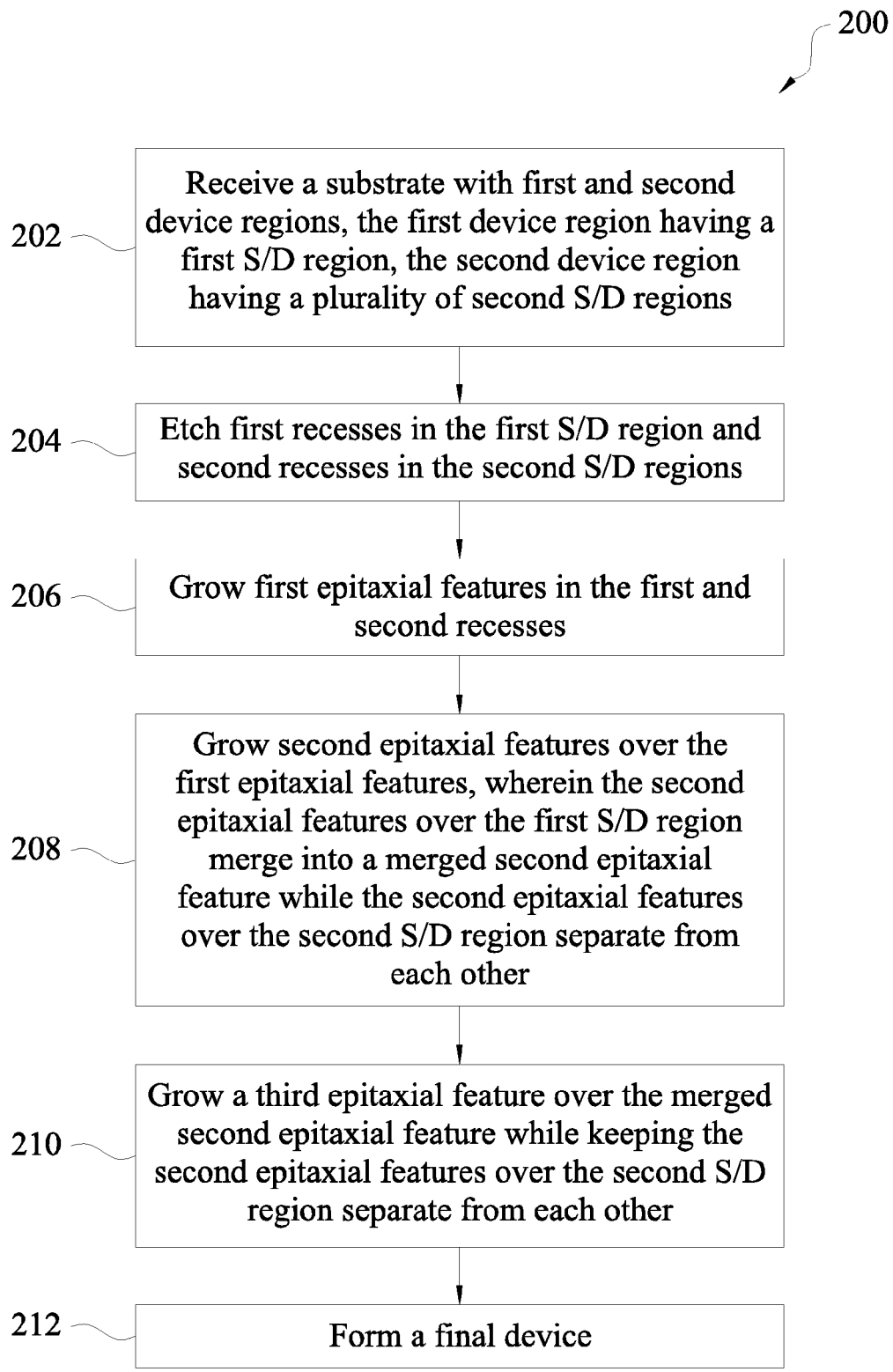
FIG. 2 shows a block diagram of a method of forming a semiconductor device, according to various aspects of the present disclosure.

FIG. 2 shows a block diagram of a method 200 of forming a semiconductor device, such as the semiconductor device 100, according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-8B which are perspective and cross-sectional views of a semiconductor device 300 according to various aspects of the present disclosure.

As will be shown, the device 300 illustrates three FinFETs in two regions of a substrate. This is provided for simplification and ease of understanding and does not necessarily limit the embodiments to any types of devices, any number of devices, any number of regions, or any configuration of structures of regions. For example, the same inventive concept can be applied in fabricating planar FET devices. Furthermore, the device 300 may be an intermediate device fabricated during processing of an IC, or a portion thereof, that may comprise static random access memory (SRAM) and/or logic circuits, passive components such as resistors, capacitors, and inductors, and active components such as PFETs, NFETs, FinFETs, MOSFET, CMOS transistors, bipolar transistors, high voltage transistors, high frequency transistors, other memory cells, and combinations thereof.

Figure 3:
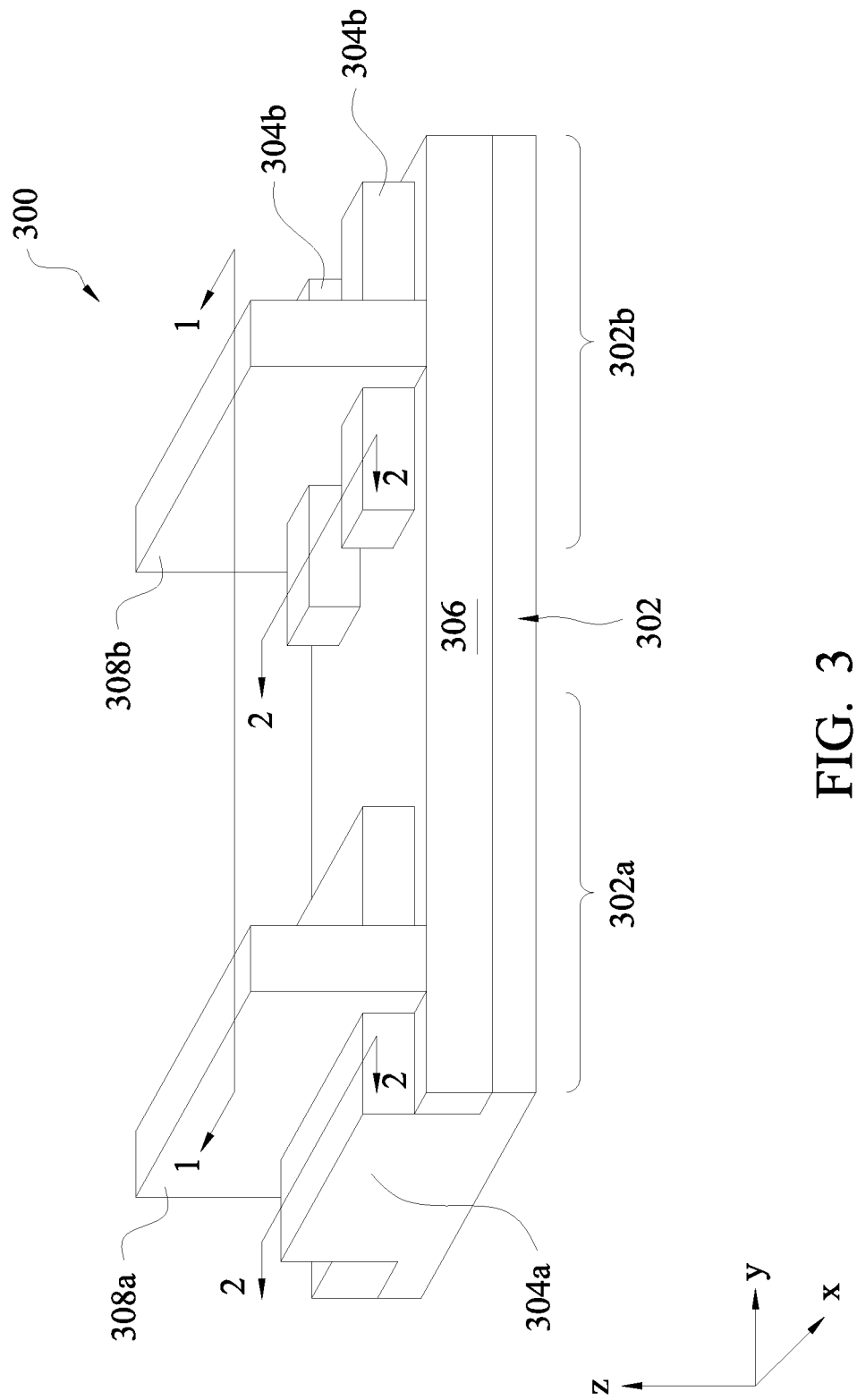
FIG. 3 illustrates a perspective view of a semiconductor device in an intermediate step of fabrication according to an embodiment of the method of FIG. 2.

At operation 202, the method 200 (FIG. 2) receives a substrate 302 with gate structures formed thereon. Referring to FIG. 3, the substrate 302 is a silicon substrate in the present embodiment. Alternatively, the substrate 302 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a semiconductor-on-insulator (SOI) such as a buried dielectric layer.

Still referring to FIG. 3, the substrate 302 further includes active regions such as p-wells and n-wells for forming active devices. In the present embodiment, the substrate 302 includes a first device region 302a and a second device region 302b. The first device region 302a includes a fin 304a that is suitable for forming FETs for a logic device. The second region 302b includes two fins 304b that are suitable for forming FETs for a memory device. In the present disclosure, the fins 304a and 304b are considered as part of the substrate 302. As shown in FIG. 3, the fin 304a is substantially wider than each individual fin 304b. In the present embodiment, the fin 304a is about three times wider than an individual fin 304b. The fins 304a/b may be fabricated using suitable processes including photolithography and etch processes. The photolithography process may include forming a photoresist layer (resist) overlying the substrate 302, exposing the resist to a pattern, performing post-exposure bake processes, and developing the resist to form a masking element including the resist. The masking element is then used for etching recesses into the substrate 302, leaving the fins 304a/b on the substrate 302. The etching process can include dry etching, wet etching, reactive ion etching (RIE), and/or other suitable processes. Alternatively, the fins 304a/b may be formed using double-patterning lithography (DPL) processes. Numerous other embodiments of methods to form the fins 304a/b may be suitable.

Still referring to FIG. 3, the fins 304a and 304b are separated by an isolation structure 306. The isolation structure 306 may be formed of silicon oxide, silicon nitride, silicon oxynitride, fluoride-doped silicate glass (FSG), a low-k dielectric material, and/or other suitable insulating material. The isolation structure 306 may be shallow trench isolation (STI) features. In an embodiment, the isolation structure 306 is formed by etching trenches in the substrate 302, e.g., as part of the fins 304a/b formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 306 may include a multi-layer structure, for example, having one or more thermal oxide liner layers.

Still referring to FIG. 3, the device 300 further includes a first gate structure 308a and a second gate structure 308b over the substrate 302. Particularly, the first gate structure 308a is in the first region 302a, engaging with the fin 304a; and the second gate structure 308b is in the second region 302b, engaging with the fins 304b. The gate structures 308a/b may each include a gate dielectric layer, a gate electrode layer, and one or more additional layers. In an embodiment, the gate structures 308a/b include polysilicon. In some embodiments, the gate structures 308a/b are sacrificial gate structures, i.e., placeholder for final gate stacks.

Figure 4A:
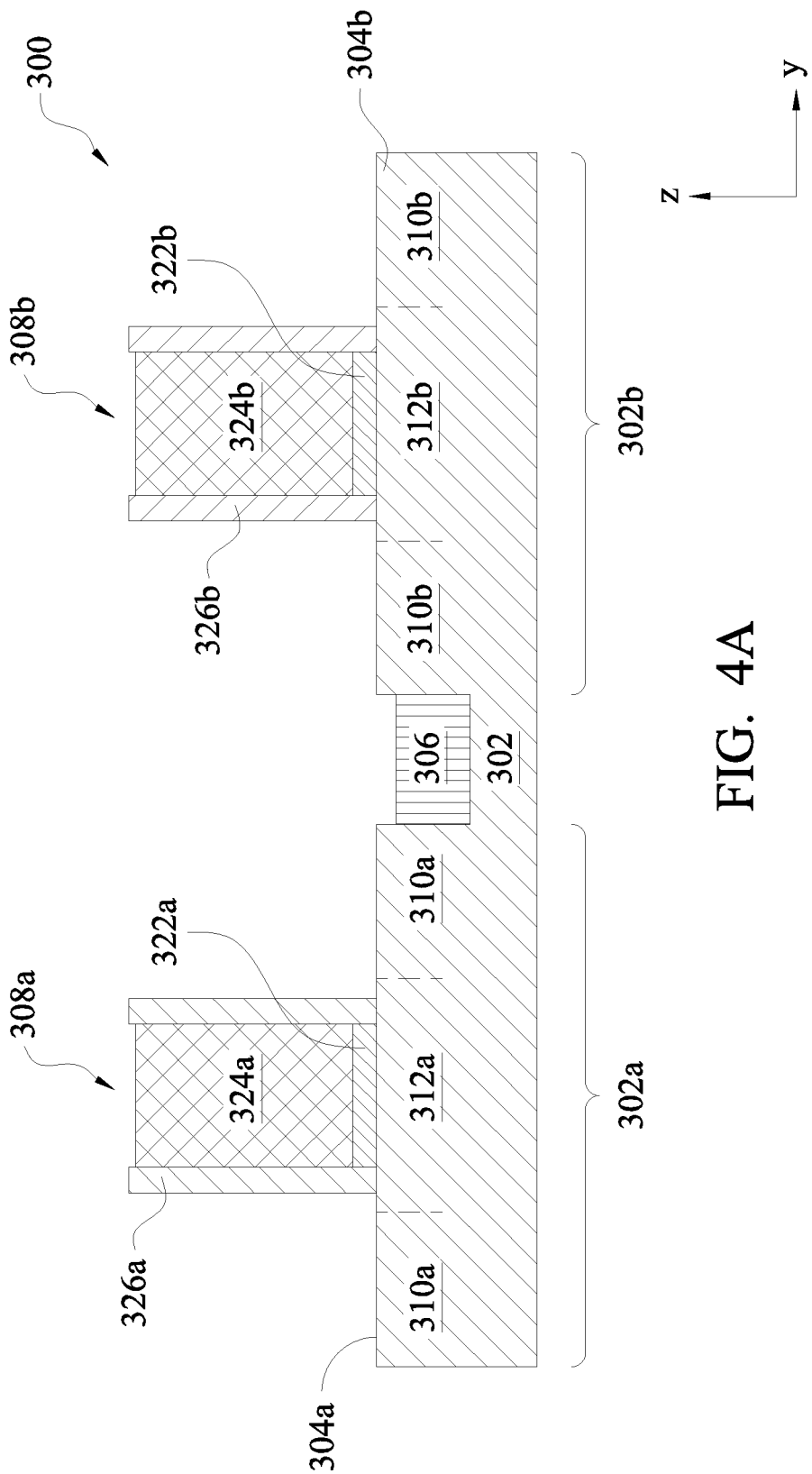
FIGS. 4A-8B illustrate cross sectional views of forming a target semiconductor device according to the method of FIG. 2, in accordance with an embodiment.
Figure 4B:
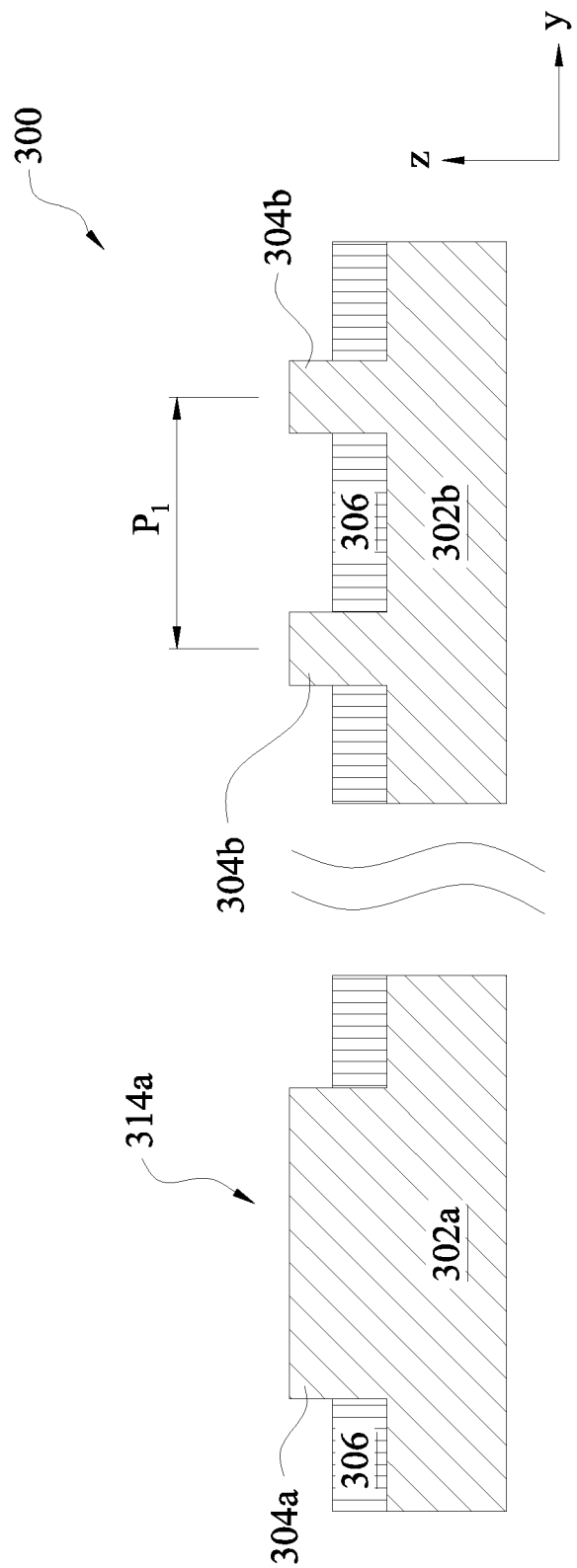

FIG. 4A is a cross-sectional view of the device 300 along the "1-1" line of FIG. 3. FIG. 4B is a cross-sectional view of the device 300 along the "2-2" lines of FIG. 3, showing both the first and second regions 302a/b in the same drawing. Referring to FIG. 4A, in the present embodiment, the gate structures 308a/b engage with the fins 304a/b and effectively divide the respective fins into three regions. In the fin 304a, there are S/D regions 310a adjacent to the gate structures 308a and a channel region 312a underneath the gate structures 308a. In fins 304b, there are S/D regions 310b adjacent to the gate structures 308b and a channel region 312b underneath the gate structures 308b.

Still referring to FIG. 4A, in the present embodiment, the gate structures 308a/b each include an oxide layer 322a/b, a gate electrode layer 324a/b, and a gate spacer 326a/b. The gate structures 308a/b may include other layers, such as a hard mask layer and a capping layer. The oxide layers 322a/b may include a dielectric material such as silicon oxide, and may be formed by chemical oxidation, thermal oxidation, atomic layer deposition (ALD), chemical vapor deposition (CVD), and/or other suitable methods. The gate electrode layers 324a/b may comprise a single layer or multilayer structure and may comprise polysilicon. The gate electrode layers 324a/b may be formed by suitable deposition processes such as low-pressure chemical vapor deposition (LPCVD) and plasma-enhanced CVD (PECVD). The gate spacers 326a/b may comprise a single layer or multilayer structure and may comprise a dielectric material such as silicon nitride (SiN). The gate spacers 326a/b may be formed by ALD, thermal deposition, or other suitable methods.

Referring to FIG. 4B, the fin 304a provides a relatively wide top surface 314a. The fins 304b are relatively narrow and have a center-to-center pitch "$P_1$." In an embodiment, each of the fins 304a/b is lightly doped using a process such as ion implantation. For example, an ion implantation process may utilize n-type dopants, such as phosphorus (P) or arsenic (As), for NFET devices and p-type dopants, such as boron (B) or indium (In), for PFET devices.

Figure 5A:
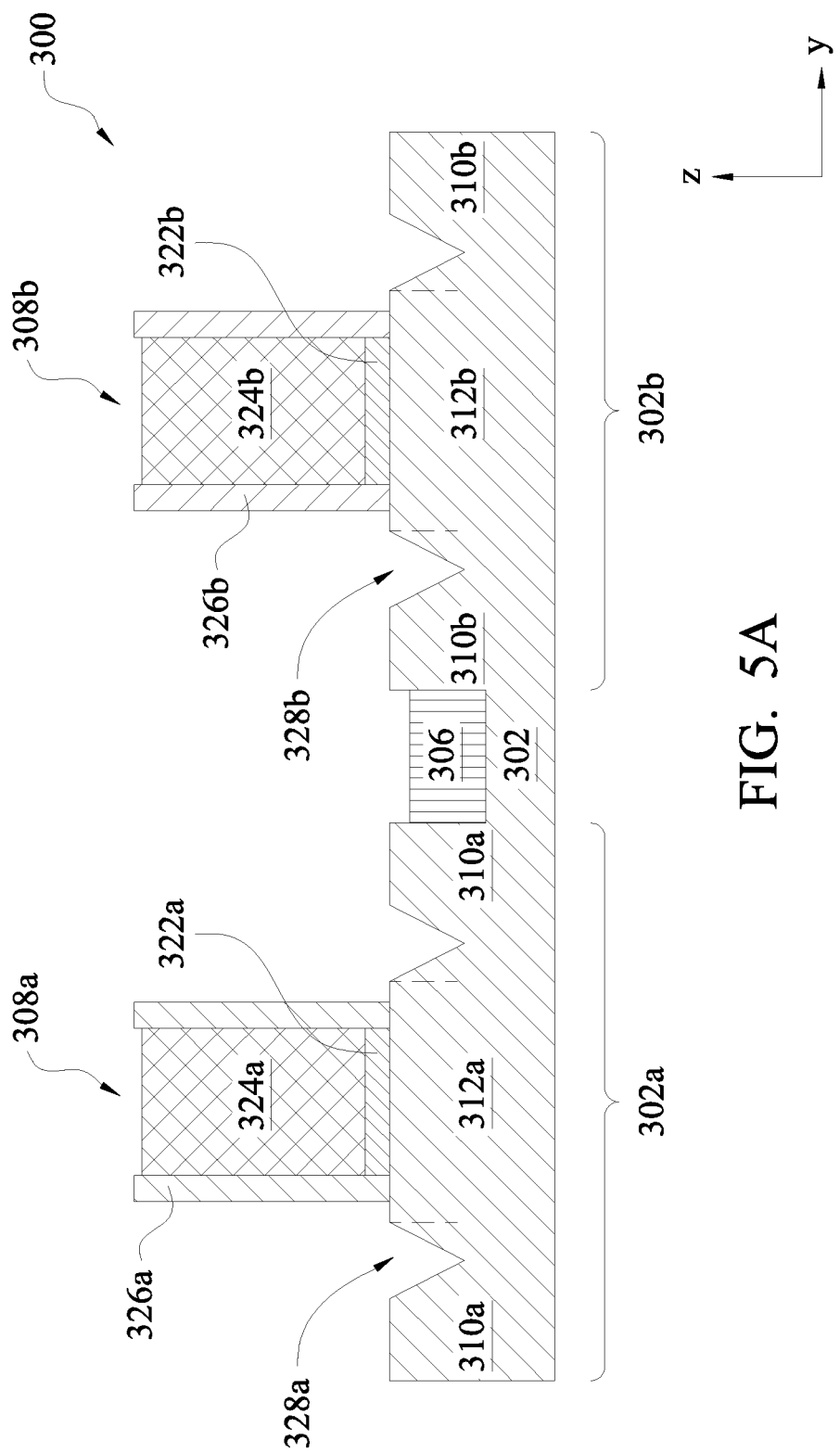
Figure 5B:
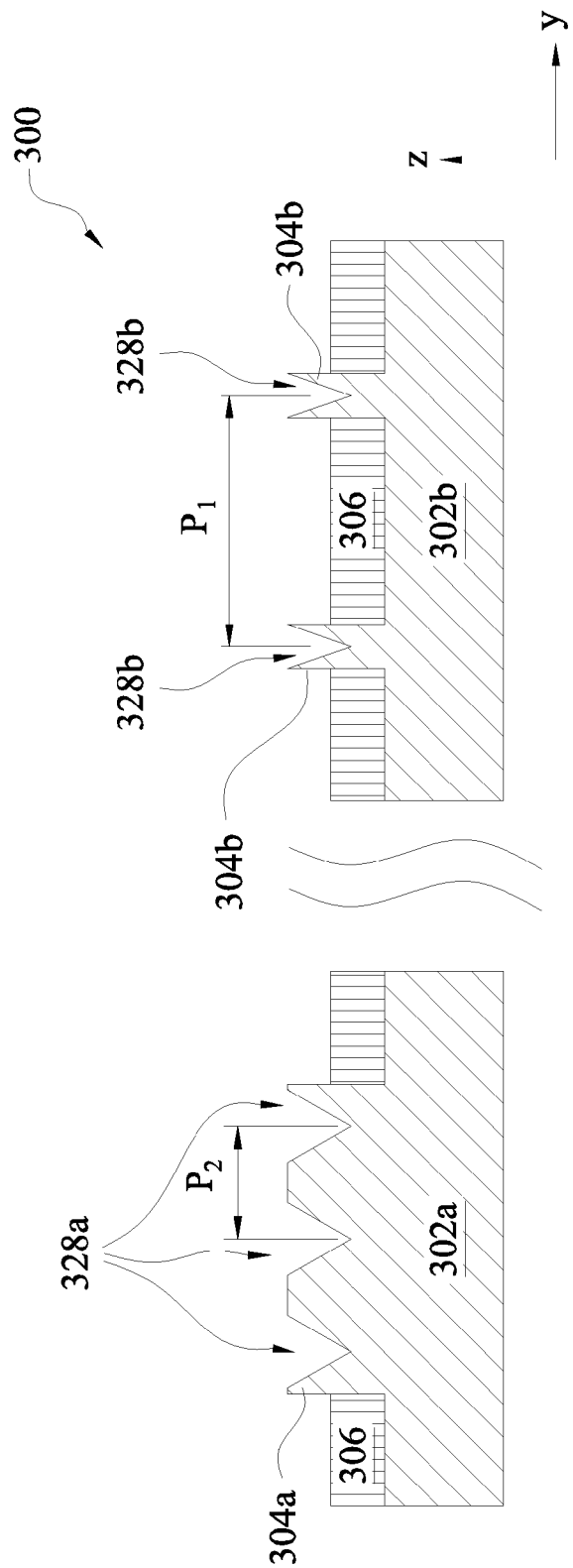

The method 200 (FIG. 2) proceeds to operation 204 to etch the fins 304a and 304b thereby forming recesses in the respective S/D regions 310a and 310b. Referring to FIGS. 5A and 5B, a plurality of recesses 328a and 328b are formed in the S/D regions 310a and 310b respectively. In an embodiment, one or more photolithography processes are used to define the regions to be etched. In an embodiment, at least two recesses are formed in each of the S/D regions 310a and only one recess is formed in each of the S/D regions 310b. In the embodiment shown in FIG. 5B, three recesses 328a are formed in each S/D region 310a with a pitch "$P_2$." The recesses 328a/b are formed in the S/D regions 310a/b adjacent to the gate structure 308a/b. The recesses 328a/b may have vertical sidewalls, tapered sidewalls, or other profiles. The etching process may be dry (plasma) etching, wet etching, and the like. In an embodiment, the etching process includes a dry etching process that utilizes a combination of $HBr/Cl_2/O_2/He$. In another embodiment, the etching process includes a dry etching process that utilizes a combination of $GeH_4/HCl/H_2/N_2$. After the etching process, a cleaning process may be performed that cleans the recesses 328a/b with a hydrofluoric acid (HF) solution or other suitable solution.

Figure 6A:
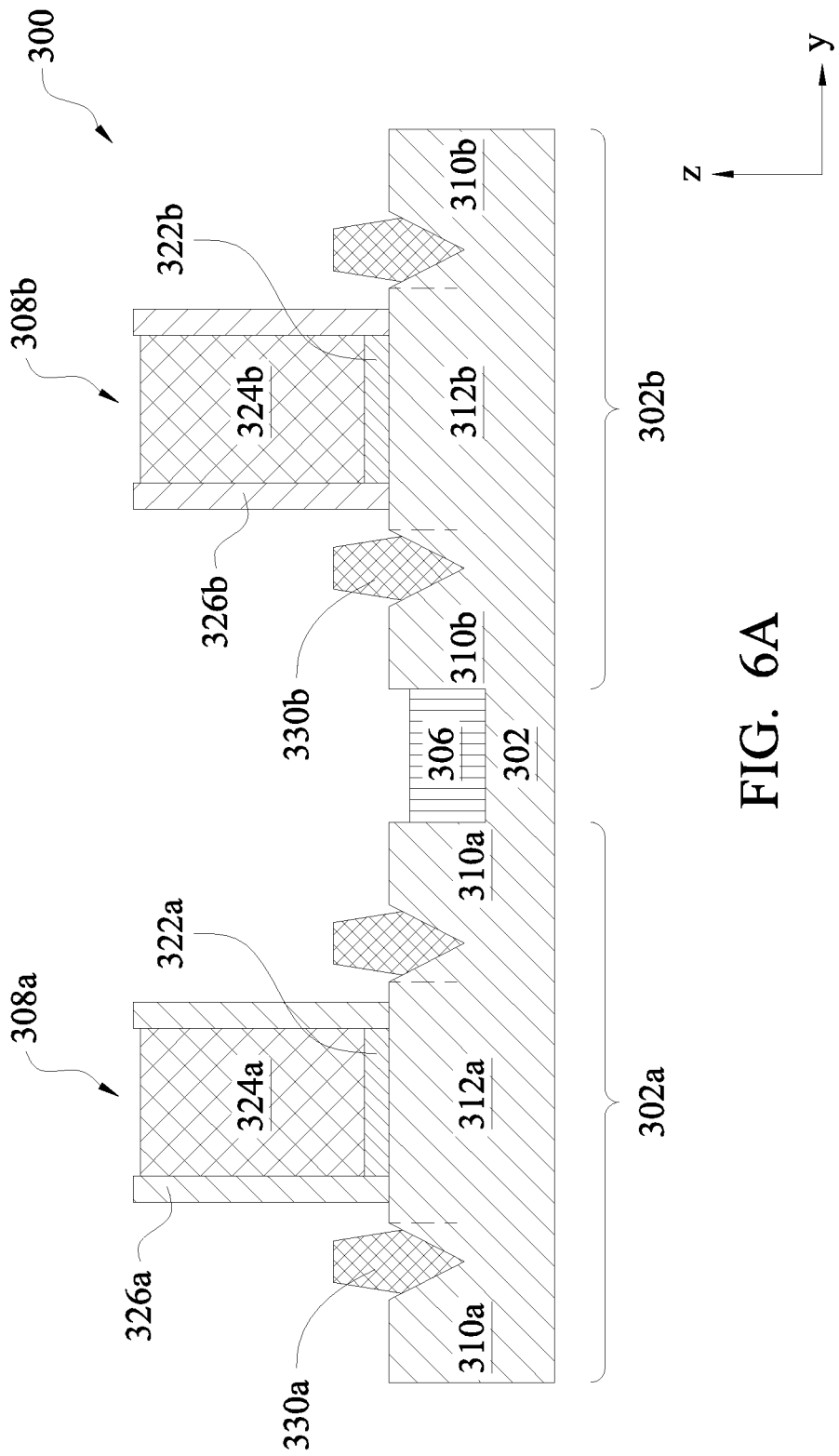
Figure 6B:
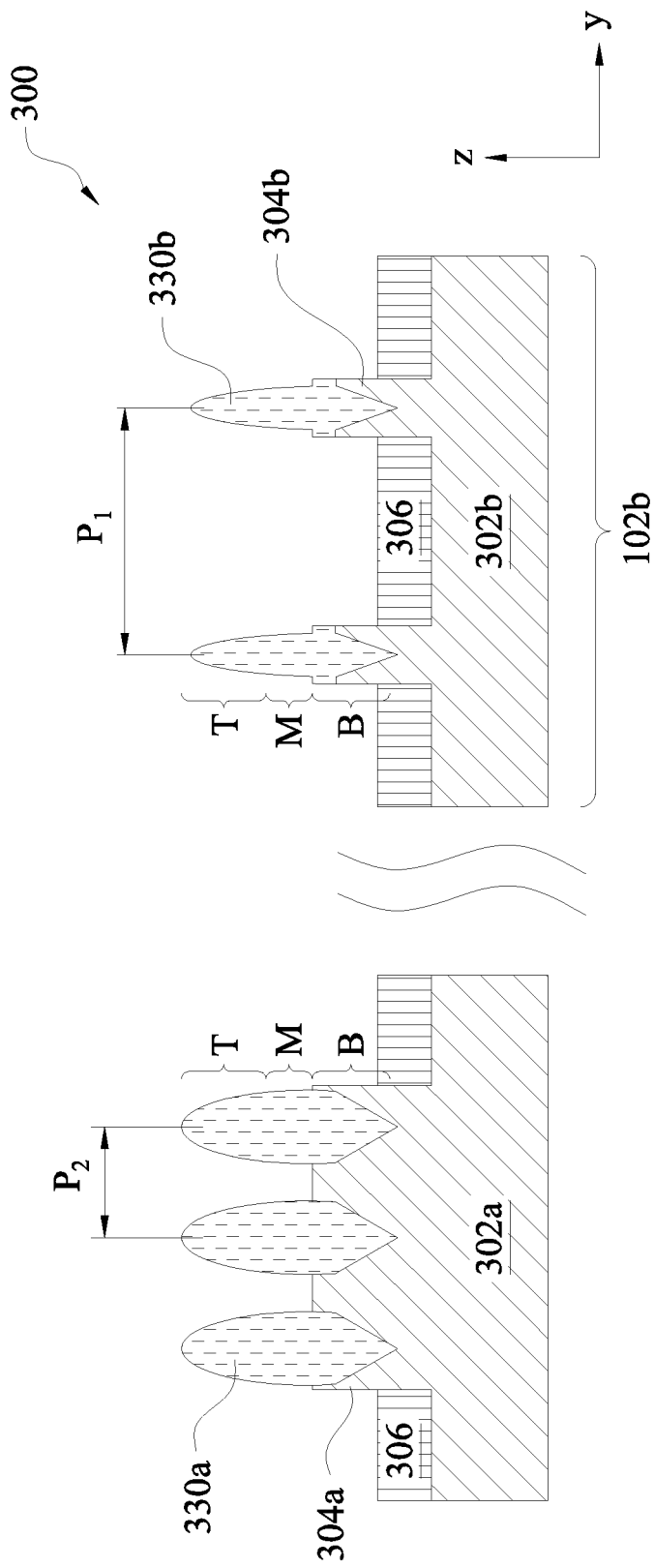

The method 200 (FIG. 2) proceeds to operation 206 to grow a plurality of first epitaxial features in the recesses 328a/b. Referring to FIGS. 6A and 6B, first epitaxial features 330a and 330b grow in the recesses 328a and 328b respectively. As the epitaxy growth process continues, the first epitaxial features 330a/b further extend out of the respective recesses. As shown in FIG. 6B, each of the first epitaxial features 330a/b may be viewed to have three portions (or sections): a bottom portion "B," a middle portion "M," and a top portion "T." The bottom portion is in a respective recess (e.g., the recess 328a of FIG. 5B). The middle portion is over the bottom portion and is adjacent to a top surface of a respective S/D region (e.g., the surface 314a of FIG. 4B). The top portion extends upwardly over the middle portion. The first epitaxial features 330a/b are semiconductor materials for forming raised S/D features. In the present embodiment, the first epitaxial features 330a/b include SiGe for forming raised S/D features for p-type devices. Furthermore, the epitaxy growth process in-situ dopes the grown SiGe with a p-type dopant such as boron or indium for forming doped SiGe features for p-type devices. For example, SiGe may be doped with boron with a dopant concentration in a range from about $2 \times e^{20}$ cm$^{-3}$ to about $3 \times e^{21}$ cm$^{-3}$. In another embodiment, the first epitaxial features 330a/b include silicon for forming raised S/D features for n-type devices. To further this embodiment, the epitaxy growth process in-situ dopes the grown silicon with an n-type dopant such as phosphorus, or arsenic, or combinations thereof for forming doped silicon features for n-type devices. In an embodiment, the epitaxy growth process is a low pressure chemical vapor deposition (LPCVD) process using a silicon-based precursor gas. In another embodiment, the epitaxy growth process is a selective epitaxy growth (SEG) process.

In the present embodiment, the epitaxy growth process is a cyclic deposition and etching (CDE) process. The CDE process is a two cycle operation with a precursor having chlorine for deposition and etching effects and selectively deposits a semiconductor material in the recesses 328a/b. In the first cycle for deposition, the various chemicals are used as precursor to epitaxially grow the semiconductor material. In the second cycle, chlorine-containing gas (such as HCl, Cl2 or both) is used for etching. The CDE process repeats the two cycles until the first epitaxial features 330a/b are formed.

In the present embodiment, the semiconductor material is SiGe having a Ge-to-Si ratio in a range from about 10% to about 80% and the first epitaxial features 330a/b are formed by a CDE process. For example, the CDE process may use HCl as the etching gas and a gas mixture of $GeH_4$ and $H_2$ as the deposition gas which contains about 1% to about 10% $GeH_4$ in $H_2$. During the CDE process, the deposition gas flow rate and the etching gas flow rate are tuned to produce an epitaxial feature that is more upright, as shown in FIG. 6B. This is possible because the growth rate of a semiconductor material is typically orientation dependent. For example, for a silicon crystal, its growth rate at the crystal direction [100] is greater than its growth rate at the crystal direction [110] that is in turn greater than its growth rate at the crystal direction [111] (the "1" and "0" numbers are Miller Indexes). By tuning the deposition rate and etching rate of the semiconductor material, the epitaxial features 330a/b can be tuned to grow at a specific orientation. In the embodiment shown in FIGS. 6A and 6B, the "z" axis represents the crystal direction [100], the "x" axis represents the crystal direction [110], and the "y" axis represents the crystal direction [111]. The epitaxial features 330a/b are tuned to grow more along the "z" axis than along the "x" and "y" axis. In an embodiment, to form the first epitaxial features 330a/b in a CDE process, the flow rate of the deposition gas mixture of $GeH_4$ and $H_2$ is set to about 100 to about 1000 standard cubic centimeters per minute (sccm), the flow rate of the etching gas HCl is set to about 50 to about 1000 sccm, and a ratio of a flow rate of the deposition gas mixture to a flow rate of the etching gas is set to about 2.5 to about 10.

In an embodiment, the middle portions of the first epitaxial features 330a merge as they grow (not shown). As will be shown later in the present disclosure, this may be intended and may benefit the final device by creating more stress to the channel region 312a. However, the first epitaxial features 330b remain separate from each other. In an embodiment, operation 206 grows both the epitaxial features 330a and 330b by the same process. This eliminates the need for a masking element to cover the region 302a or the region 302b.

Figure 7A:
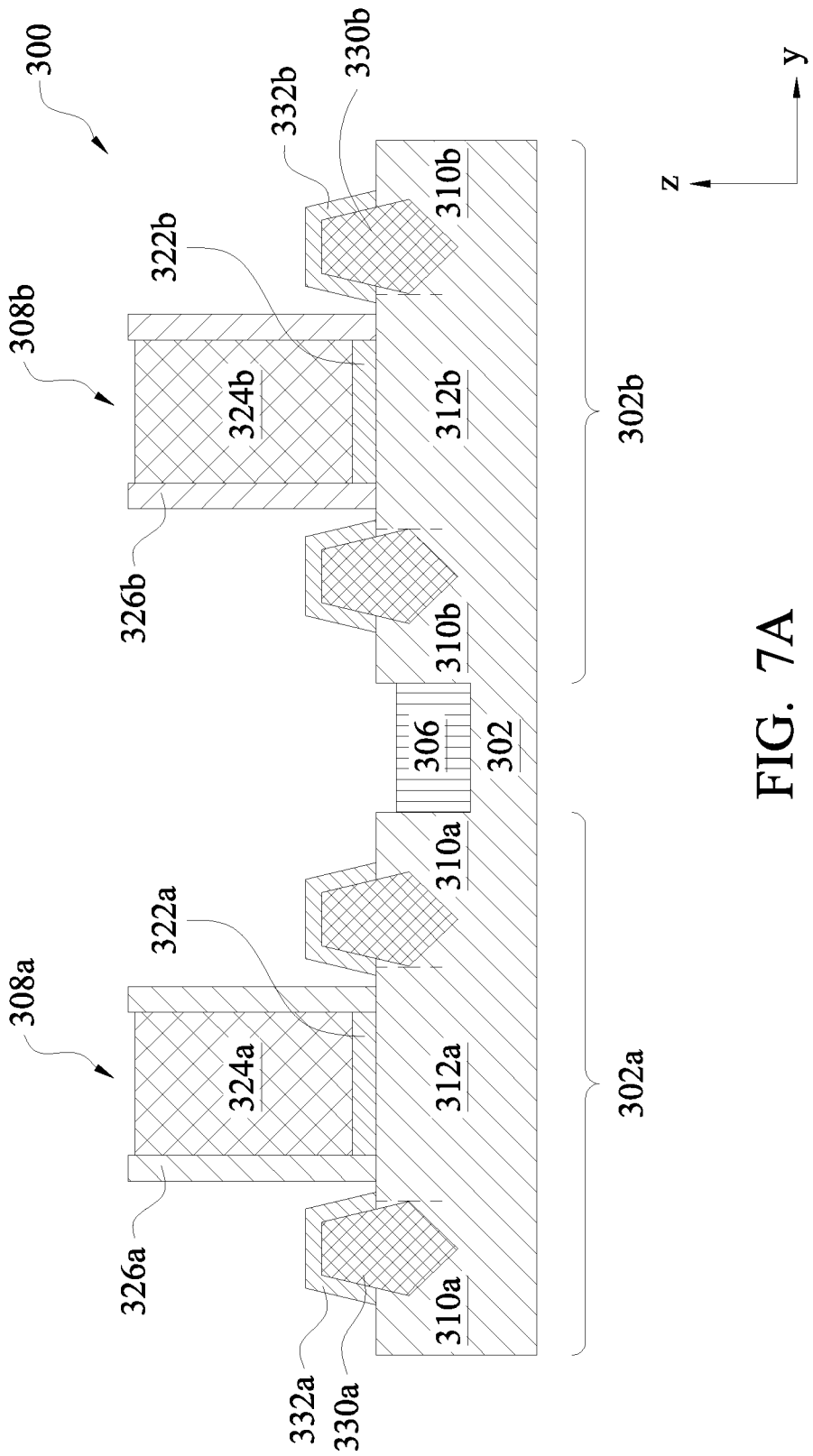
Figure 7B:
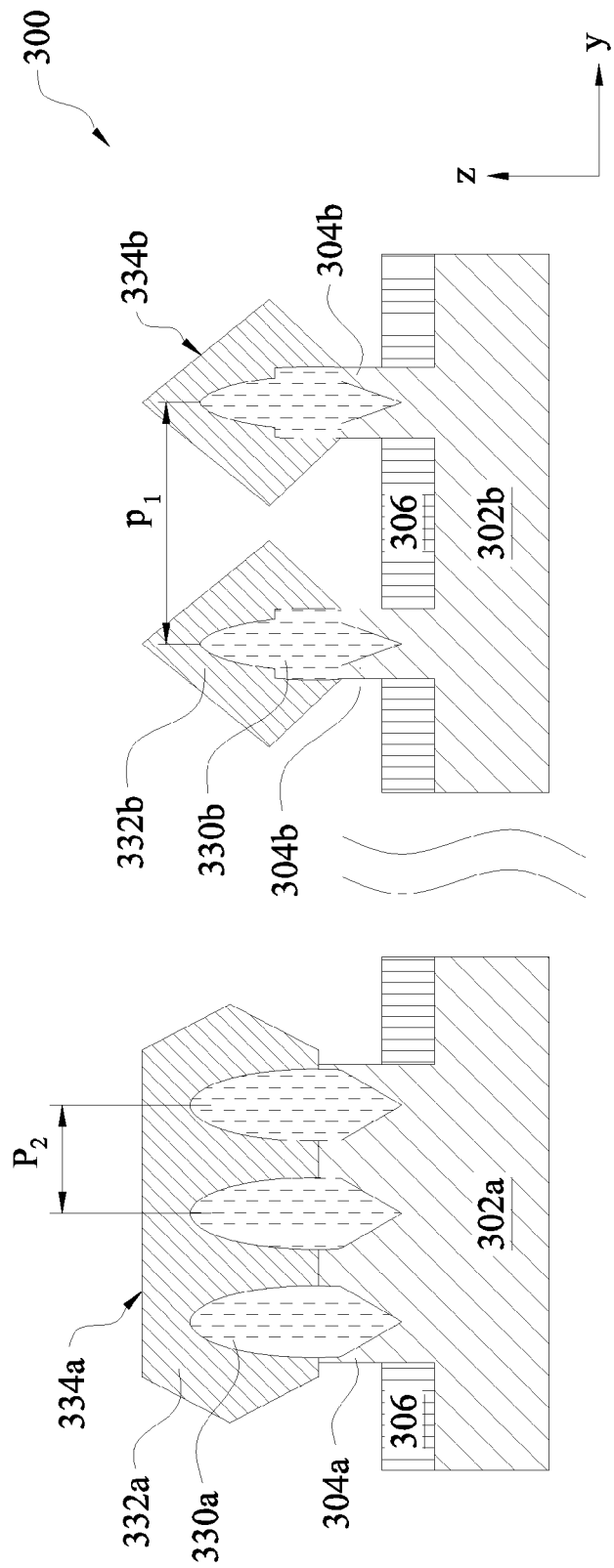

The method 200 (FIG. 2) proceeds to operation 208 to grow a plurality of second epitaxial features 332a and 332b over the first epitaxial features 330a and 330b respectively. Referring to FIGS. 7A and 7B, the second epitaxial features 332a/b grow over the first epitaxial features 330a/b and over the S/D regions 310a/b. In particular, the second epitaxial features 332a merge into one piece, referred to as the merged second epitaxial feature 332a, while the second epitaxial features 332b separate from each other. In the present embodiment, the merged second epitaxial feature 332a provides a flat top surface 334a that is parallel to the surface 314a (FIG. 4B). In an embodiment, the substrate 302 is a silicon substrate and both the surfaces 314a and 334a are in silicon crystal plane (100). Alternatively, both the surfaces 314a and 334a may be in another silicon crystal plane. In contrast, the second epitaxial features 332b do not have such flat top surface and their surfaces 334b are in a different crystal plane, such as silicon crystal plane (111). In the present embodiment, the merged second epitaxial feature 332a provides benefits to the device 300 in the logic device region 302a. For example, it reduces S/D resistance and enhances carrier mobility in the channel region 312a. On the other hand, the second epitaxial features 332b remain separate to avoid shorting two S/D regions in the memory device region 302b.

In an embodiment, operation 208 uses an epitaxy growth process similar to that in operation 206. For example, operation 208 may also use a CDE process to grow the second epitaxial features 332a/b. However, operation 208 may use a different ratio between the deposition gas flow rate and the etching gas flow rate. For example, operation 208 may be tuned to allow silicon to grow in the crystal direction [111] so that the second epitaxial features 332a can properly merge. In an embodiment, the second epitaxial features 332a and 332b are grown by the same process and at about the same growth rate. To further this embodiment, the pitches "$P_1$" and "$P_2$" are designed such that, when the second epitaxial features 332a properly merge into one piece, the second epitaxial features 332b still clear from each other by a design margin.

Figure 8A:
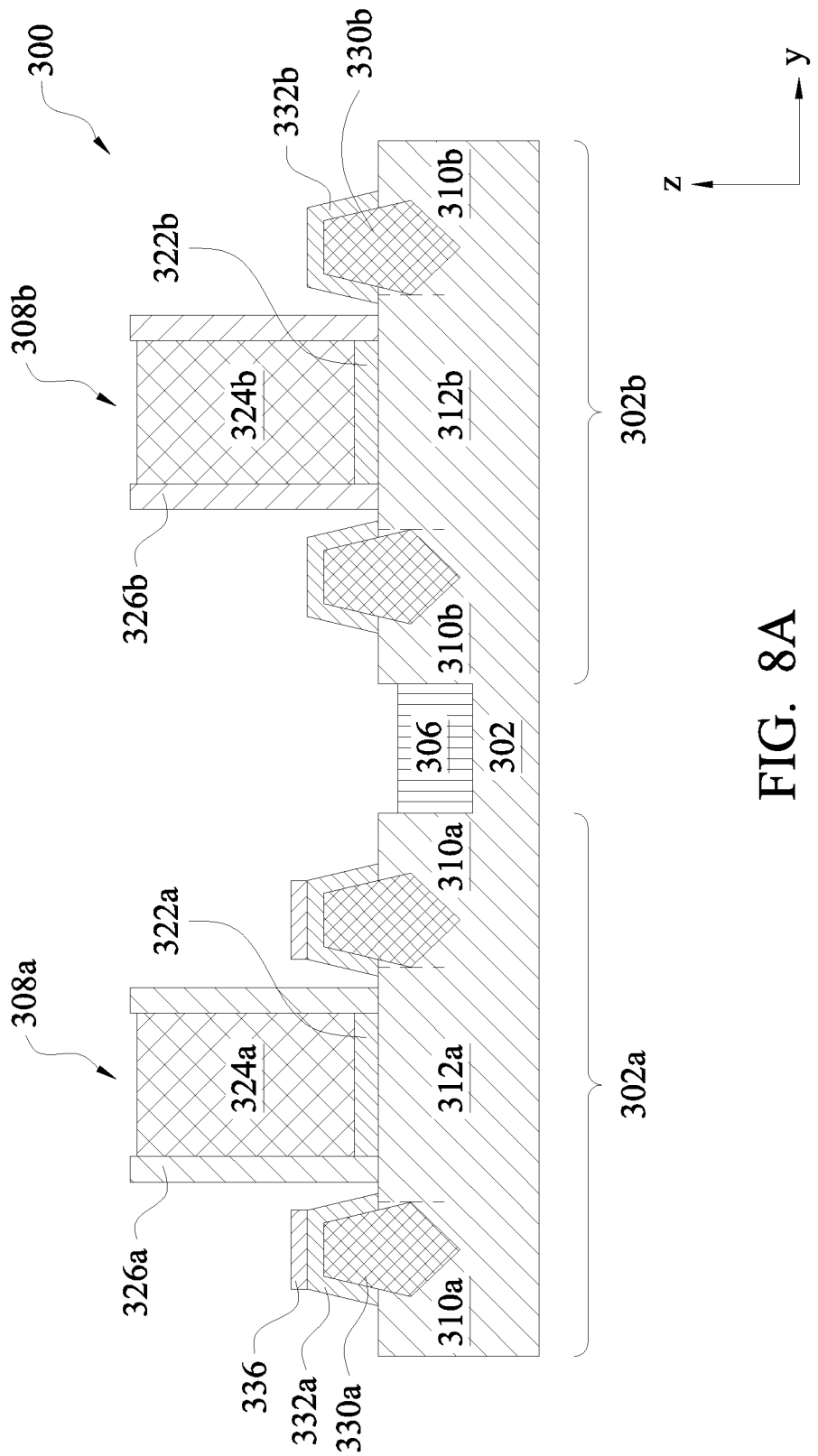
Figure 8B:
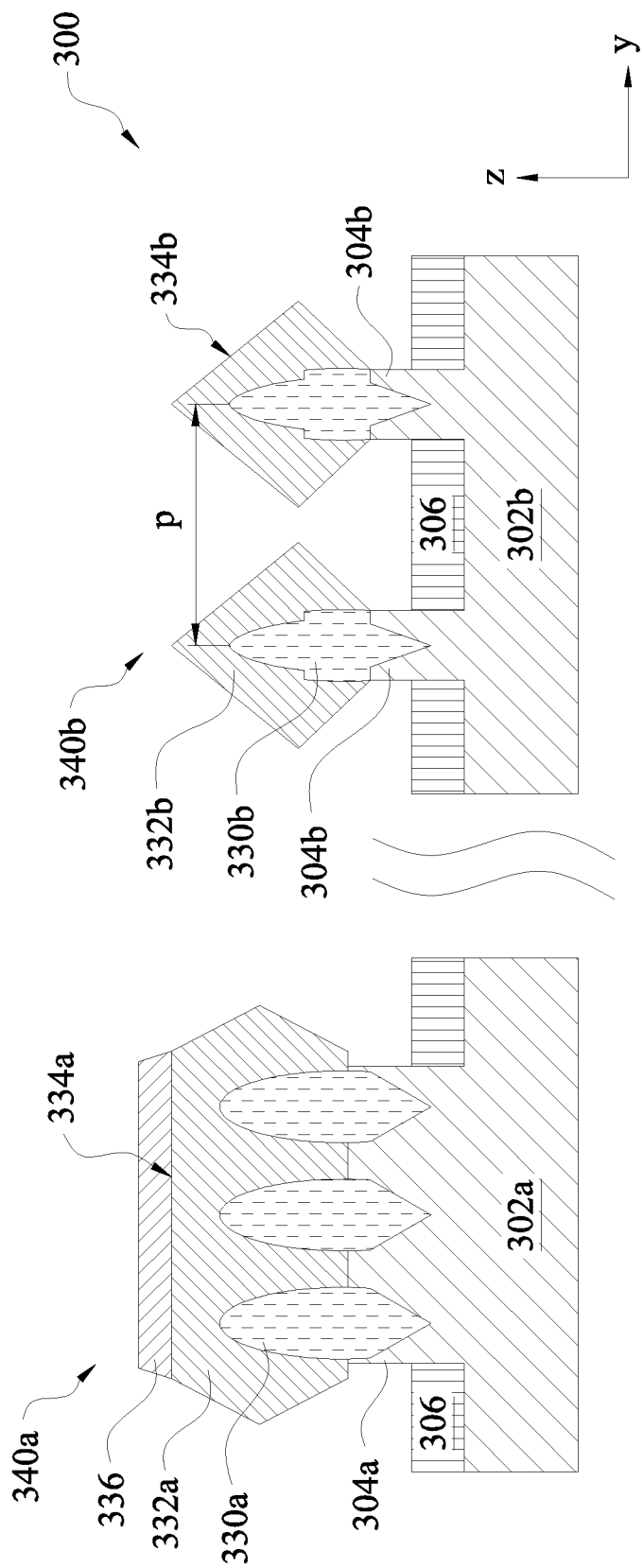

The method 200 (FIG. 2) proceeds to operation 210 to grow a third epitaxial feature 336 over the merged second epitaxial feature 332a while keeping the second epitaxial features 332b separate from each other. Referring to FIGS. 8A and 8B, the third epitaxial feature 336 grows over the surface 334a. In an embodiment, operation 210 uses an epitaxy growth process similar to that in operation 206. For example, operation 210 may also use a CDE process to grow the third epitaxial feature 336. In the present embodiment, since the surface 334a is in the (100) crystal plane and the surfaces 334b are not in the (100) crystal plane (e.g., they are in (111) plane), the epitaxy growth process of operation 210 is tuned to grow semiconductor materials on the surface 334a along the "z" axis but not on the surfaces 334b. For example, the CDE process may use a deposition gas mixture of about 1% to about 10% $GeH_4$ in $H_2$, an etching gas of HCl, and a ratio of a flow rate of the deposition gas mixture to a flow rate of the etching gas about 2.5 to about 10.

In the present embodiment, the first, second, and third epitaxial features 330a, 332a, and 336 are collectively referred to as an epitaxial feature 340a. The epitaxial feature 340a has a plurality of bottom portions that are the bottom portions of the first epitaxial features 330a ("B" in FIG. 6B). The epitaxial feature 340a has a top portion that includes the middle and top portions of the first epitaxial features 330a (FIG. 6B), the second epitaxial feature 332a, and the third epitaxial feature 336. In an embodiment, the first, second, and third epitaxial features 330a, 332a, and 336 are of the same material. For example, they are SiGe features doped with the same concentration of boron. In that case, the interface among them may not be present and the three epitaxial features may be integrated into one crystal structure. Alternatively, the three epitaxial features may have different semiconductor materials, may be doped with different dopants, or may have different dopant concentrations.

In the present embodiment, a pair of first and second epitaxial features 330b and 332b is collectively referred to as an epitaxial feature 340b. There is a plurality of epitaxial features 340b (two shown) in the memory device region 302b and they separate from each other. Each epitaxial feature 340b has a bottom portion that is the bottom portion of the first epitaxial feature 330b ("B" in FIG. 6B). Each epitaxial feature 340b has a top portion that includes the middle and top portions of the first epitaxial feature 330b (FIG. 6B) and the second epitaxial feature 332b. In an embodiment, the first and second epitaxial features 330b and 332b are of the same material. In that case, the interface between them may not be present and the two epitaxial features may be integrated into one crystal structure. Alternatively, the two epitaxial features may have different semiconductor materials, may be doped with different dopants, or may have different dopant concentrations.

The method 200 (FIG. 2) proceeds to operation 212 to form a final device. This includes a variety of processes. In one example, silicide features are formed on the epitaxial features 336 and 332b. For example, silicide features, such as nickel silicide, may be formed by depositing a metal layer over the epitaxial features, annealing the metal layer such that the metal layer reacts with silicon in the epitaxial features to form the metal silicide features, and thereafter removing the non-reacted metal layer. In an embodiment of the method 200, operation 210 may be skipped and the device 300 shown in FIGS. 7A and 7B is passed to operation 212. To further this embodiment, silicide features may be formed on the epitaxial features 332a and 332b. Other steps may be performed to complete the fabrication of the semiconductor device 300. For example, operation 212 may optionally replace dummy gate structures; form inter-layer dielectric layer (ILD); form source, drain, and gate contacts; form vias; form metal interconnects; and/or perform other processes.

Although not intended to be limiting, one or more embodiments of the present disclosure provide many benefits to a semiconductor device and the formation thereof. For example, epitaxial features can be selectively grown in source/drain regions of a logic device region and a memory device region by the same epitaxy growth process. This simplifies both mask making process and device fabrication process. For example, epitaxial features in a logic device region can be grown to have a wider and taller profile than those in a memory device region. In various embodiments of the present disclosure, this can be achieved by controlling S/D recess etching, epitaxy deposition rate and etching rate, and epitaxial feature orientation. The wider and taller epitaxial features in a logic device region provide sufficient stress for improving logic devices' performance. They also reduce S/D contact resistance for the logic devices. At the same time, epitaxial features in a memory device region are well controlled to have a narrower profile so that device density in the memory device region is improved.

In one exemplary aspect, the present disclosure is directed to a method of forming a semiconductor device. The method includes providing a semiconductor substrate with first and second device regions, wherein the first device region includes a first source/drain (S/D) region and the second device region includes a plurality of second S/D regions. The method further includes etching a plurality of first recesses in the first S/D region and a plurality of second recesses in the second S/D regions, and growing a first plurality of first epitaxial features in the first recesses and a second plurality of first epitaxial features in the second recesses. The method further includes growing a third plurality of second epitaxial features over the first plurality and a fourth plurality of second epitaxial features over the second plurality, wherein the third plurality merge into a merged second epitaxial feature and the fourth plurality separate from each other.

In another exemplary aspect, the present disclosure is directed to a method of forming a FinFET device. The method includes providing a silicon substrate with a first device region and a second device region, wherein the first device region includes a first silicon fin and the second device region includes a plurality of second silicon fins. The method further includes etching a plurality of first recesses in an S/D region of the first silicon fin and a plurality of second recesses in S/D regions of the second silicon fins, and growing a first plurality of first epitaxial features in the first recesses and a second plurality of first epitaxial features in the second recesses. The method further includes growing a third plurality of second epitaxial features over the first plurality and a fourth plurality of second epitaxial features over the second plurality, wherein the third plurality merge into a merged second epitaxial feature and the fourth plurality separate from each other. The method further includes growing a third epitaxial feature over the merged second epitaxial feature, while keeping the fourth plurality separate from each other.

In another exemplary aspect, the present disclosure is directed to a semiconductor device. The semiconductor device includes a substrate having a first device region and a second device region, wherein the first device region includes a first source/drain (S/D) region and the second device region includes a plurality of second S/D regions. The semiconductor device further includes a plurality of first recesses in the first S/D region. The semiconductor device further includes a first epitaxial feature having bottom portions and a top portion over the bottom portions, wherein each of the bottom portions is in one of the first recesses and the top portion is over the first S/D region. The semiconductor device further includes a plurality of second recesses, one in each of the second S/D regions, and a plurality of second epitaxial features each having a bottom portion in one of the second recesses, wherein the second epitaxial features separate from each other.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a semiconductor substrate with first and second device regions, wherein the first device region includes a first source/drain (S/D) region and the second device region includes a plurality of second S/D regions;
   etching a plurality of first recesses in the first S/D region and a plurality of second recesses in the second S/D regions;
   growing a first plurality of first epitaxial features in the first recesses and a second plurality of first epitaxial features in the second recesses; and
   growing a third plurality of second epitaxial features over the first plurality and a fourth plurality of second epitaxial features over the second plurality, wherein the third plurality merge into a merged second epitaxial feature and the fourth plurality separate from each other.

2. The method of claim 1, further comprising:
   growing a third epitaxial feature over the merged second epitaxial feature while keeping the fourth plurality separate from each other.

3. The method of claim 2, wherein each of the first, second, and third epitaxial features includes SiGe.

4. The method of claim 3, wherein the first, second, and third epitaxial features have a Ge-to-Si ratio in a range from about 10% to about 80%.

5. The method of claim 3, wherein the first, second, and third epitaxial features are in-situ doped with boron with a dopant concentration in a range from about $2 \times e^{20}$ cm$^{-3}$ to about $3 \times e^{21}$ cm$^{3}$.

6. The method of claim 3, wherein the first, second, and third epitaxial features include SiGe formed by cyclic deposition and etching (CDE) processes.

7. The method of claim 6, wherein the CDE process forming the first epitaxial features uses a deposition gas mixture of about 1% to about 10% GeH$_4$ in H$_2$, an etching gas of HCl, and a ratio of a flow rate of the deposition gas mixture to a flow rate of the etching gas is about 2.5 to about 10.

8. The method of claim 7, wherein the flow rate of the deposition gas mixture is about 100 to about 1000 standard cubic centimeters per minute (sccm) and the flow rate of the etching gas is about 50 to about 1000 sccm.

9. The method of claim 6, wherein the CDE process forming the third epitaxial feature uses a deposition gas mixture of about 1% to about 10% GeH$_4$ in H$_2$, an etching gas of HCl, and a ratio of a flow rate of the deposition gas mixture to a flow rate of the etching gas is about 2.5 to about 10.

10. The method of claim 2, wherein the semiconductor substrate is a silicon substrate and the merged second epitaxial feature provides a top surface in (100) silicon crystal plane.

11. The method of claim 1, wherein the plurality of first recesses includes at least three recesses.

12. The method of claim 1, wherein the first device region is for forming logic field-effect transistor (FET) devices and the second device region is for forming SRAM FET devices.

13. A method of forming a FinFET device, comprising:
   providing a silicon substrate with a first device region and a second device region, wherein the first device region includes a first silicon fin and the second device region includes a plurality of second silicon fins;

etching a plurality of first recesses in an S/D region of the first silicon fin and a plurality of second recesses in S/D regions of the second silicon fins;

growing a first plurality of first epitaxial features in the first recesses and a second plurality of first epitaxial features in the second recesses;

growing a third plurality of second epitaxial features over the first plurality and a fourth plurality of second epitaxial features over the second plurality, wherein the third plurality merge into a merged second epitaxial feature and the fourth plurality separate from each other; and growing a third epitaxial feature over the merged second epitaxial feature, while keeping the fourth plurality separate from each other.

14. The method of claim 13, wherein the first, second, and third epitaxial features include SiGe for forming raised S/D features for p-type devices.

15. The method of claim 13, wherein the first, second, and third epitaxial features include Si for forming raised S/D features for n-type devices.

16. The method of claim 13, wherein the first device region is for logic FinFET devices and the second device region is for SRAM FinFET devices.

17. A semiconductor device, comprising:
a substrate having a first device region and a second device region, wherein the first device region includes a first source/drain (S/D) region and the second device region includes a plurality of second S/D regions;
a plurality of first recesses in the first S/D region;
a first epitaxial feature having bottom portions and a top portion over the bottom portions, wherein each of the bottom portions is in one of the first recesses and the top portion is over the first S/D region;
a plurality of second recesses, one in each of the second S/D regions; and
a plurality of second epitaxial features each having a bottom portion in one of the second recesses, wherein the second epitaxial features separate from each other.

18. The semiconductor device of claim 17, wherein the first and second epitaxial features include SiGe.

19. The semiconductor device of claim 17, wherein the first epitaxial feature is a raised S/D feature for a logic field-effect transistor (FET) device and the second epitaxial features each are a raised S/D feature for a memory FET device.

20. The semiconductor device of claim 17, wherein the substrate is a silicon substrate and the first and second S/D regions are formed in silicon fins of the substrate.

* * * * *